United States Patent
Bangera et al.

(10) Patent No.: US 12,004,313 B2
(45) Date of Patent: Jun. 4, 2024

(54) CONNECTING MODULE FOR A COMPUTING RESOURCE

(71) Applicant: BULL SAS, Les Clayes-sous-Bois (FR)

(72) Inventors: Jithendra Bangera, Bangalore (IN); Sanjayakumar Halli, Gadag (IN)

(73) Assignee: BULL SAS, Les Clayes-sous-Bois (FR)

( * ) Notice: Subject to any disclaimer, the term of this patent is extended or adjusted under 35 U.S.C. 154(b) by 0 days.

(21) Appl. No.: 17/584,336

(22) Filed: Jan. 25, 2022

(65) Prior Publication Data
US 2022/0248543 A1    Aug. 4, 2022

(30) Foreign Application Priority Data
Feb. 1, 2021    (EP) .................................... 21154558

(51) Int. Cl.
*H05K 5/02*    (2006.01)
(52) U.S. Cl.
CPC .................................. *H05K 5/0221* (2013.01)
(58) Field of Classification Search
CPC .. H05K 5/0073; H05K 5/0069; H05K 5/0221; H05K 7/1492; H05K 7/1489; H05K 7/1409; H05K 7/1411; H05K 5/023; G06F 1/183
See application file for complete search history.

(56) References Cited

U.S. PATENT DOCUMENTS

| | | | |
|---|---|---|---|
| 9,686,883 B2 * | 6/2017 | Butterbaugh | H05K 7/1489 |
| 10,485,123 B1 | 11/2019 | Lin et al. | |
| 10,863,647 B1 | 12/2020 | Escamilla et al. | |
| 11,419,229 B1 * | 8/2022 | An | H05K 7/1489 |
| 2011/0273850 A1 * | 11/2011 | Chen | H05K 5/023 |
| | | | 292/336.3 |
| 2015/0146372 A1 * | 5/2015 | French, Jr. | H05K 7/1489 |
| | | | 29/854 |

OTHER PUBLICATIONS

European Search Report issued in EP21154558.7, dated Jun. 28, 2021 (8 pages).

* cited by examiner

*Primary Examiner* — James Wu
(74) *Attorney, Agent, or Firm* — ARC IP Law, PC; Joseph J. Mayo

(57) ABSTRACT

A connecting module that includes a body to engage with a computing resource, a first lever having a first end pivotally coupled to a first side of the body, and a second lever having a first end pivotally coupled to a second side of the body, second ends of both levers being latched with a front side of the body. The connecting module includes an actuator disposed on the front side of the body to allow disengagement of the module from the computing resource upon actuation, and to unlatch the second ends of each of the first lever and the second lever from the front side of the body. The first lever and the second lever are manually deflected with respect to first ends to allow travel of the module in a direction inward and outward with respect to the computing resource.

15 Claims, 11 Drawing Sheets

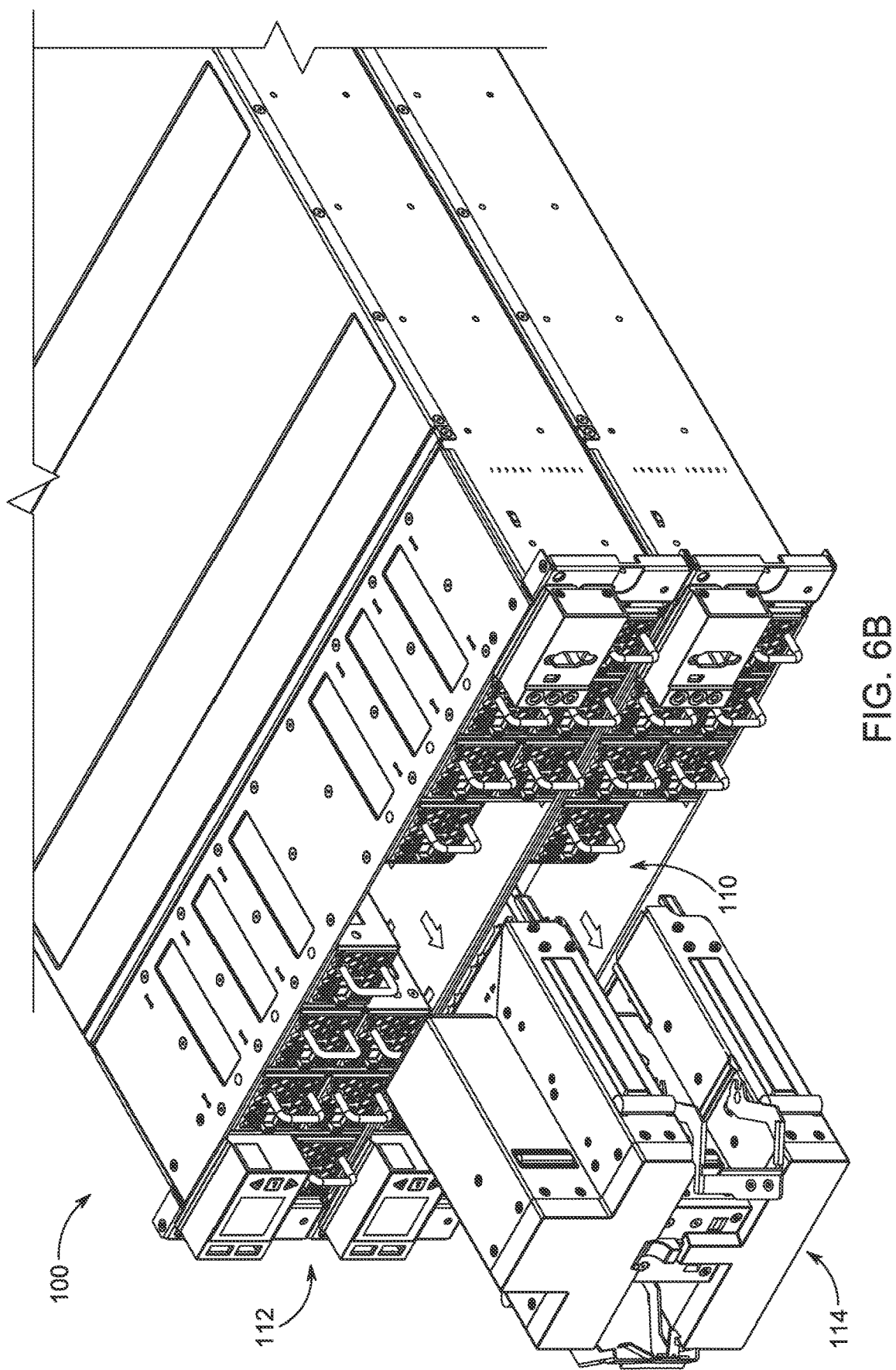

CONNECTING MODULE FOR A COMPUTING RESOURCE

This application claims priority to European Patent Application Number 21154558.7, filed 1 Feb. 2021, the specification of which is hereby incorporated herein by reference.

TECHNICAL FIELD

The present disclosure relates, in general, to a computing resource and, more specifically relates, to a connecting module for the computing resource.

BACKGROUND

High performance computing of resources, such as servers, has gained importance in recent years by several industries which are trending towards increasing sizes or combinations of two or more servers to achieve faster processing performance for a large number of processing operations. Solutions known to address such requirement of the industries include Ultra Path Interconnect (UPI) technology which provides a scalable multiprocessor system, for example, by linking motherboards of two or more computing resources together. However, users face several issues in the servers which either require a maintenance activity to be carried out on the servers and may often include replacement of few components in the servers.

Currently, in order to remove a connecting module, for example, a scalable UPI module, from the server and/or to replace a faulty Dual In-Line Memory Module (DIMM) in the server, users must invest a large amount of time by using multiple tools, which renders replacement activity complex. Conventionally, the scalable UPI module is secured to the server unit with multiple captive screws. As such, users may need to spend more time to disengage and engage the scalable UPI module from the server. Additionally, such scenarios of using multiple tools demand knowledge of use of such tools to prevent any damage to the scalable module or the server unit. As such, user ergonomics and convenience may be affected, thereby violating principles of customer replaceable unit (CRU).

Accordingly, it is one object of the present disclosure to provide a user-friendly connecting module which reduces effort and time to be invested by the user to install or remove the connecting module from computing resources.

SUMMARY

According to one aspect of the present disclosure, a connecting module is disclosed. The connecting module includes a body configured to engage with a computing resource, where a front side of the body is accessible to a user and a rear side is configured to releasably couple with the computing resource. In an embodiment, the computing resource is implemented as a server unit. The rear side of the body includes a plurality of connectors configured to connect with computing devices of the computing resource. The connecting module further includes a first lever comprising a first end pivotally coupled to a first side of the body and a second end configured to latch with the front side of the body, and a second lever comprising a first end pivotally coupled to a second side of the body and a second end configured to latch with the front side of the body, where the second side of the body is opposite to the first side of the body. The connecting module also includes an actuator disposed on the front side of the body. The actuator is configured to allow disengagement of the connecting module from the computing resource upon actuation and configured to unlatch the second ends of each of the first lever and the second lever from the front side of the body. Advantageously, each of the first lever and the second lever are selectively and manually deflectable about respective first ends thereof to allow travel of the connecting module in a direction inward and outward with respect to the computing resource.

In an embodiment, each of the first lever and the second lever are configured to pivotally deflect about respective first ends thereof with a covered angle in a range of about 30 degrees to about 50 degrees.

In another embodiment, the covered angle may be in a range of covered angle in a range of about 35 degrees to about 45 degrees.

In an embodiment, the selective and manual deflection of the first lever and the second lever may achieve travel of the connecting module in a range of about 2.5 mm to about 4 mm.

In an embodiment, the actuator includes a push button configured to slide between a first position and a second position along the front side of the body and a biasing member coupled to the push button. The biasing member is configured to retain the actuator in the first position corresponding to a normal state of the biasing member and to apply a biasing force on the actuator in the second position corresponding to a biased state of the biasing member. The second ends of each of the first lever and the second lever remain latched to the front side of the body in the normal state of the biasing member and unlatched from the front side of the body in the biased state of the biasing member. In an embodiment, the first lever and the second lever are latched to the front side of the body via a snap lock. In an embodiment, the connecting module further includes a first leaf spring to apply a biasing force on the first lever in a latched condition of the first lever and a second leaf spring to apply a biasing force on the second lever in a latched condition of the second lever.

The body of the connecting module further includes a first interconnect part to engage with a first section of the computing resource and a second interconnect part configured to engage with a second section of the computing resource. The first section includes a first set of computing devices and the second section includes a second set of computing devices. Each of the first interconnect part and the second interconnect part extends from the front side of the body along a width thereof. In an embodiment, the first interconnect part and the second interconnect part are separated by a gap configured to receive a partition plate of the computing resource, where the partition plate is located between the first section of the computing resource and the second section of the computing resource.

In an embodiment, the partition plate includes a first stopper, and the first lever includes a first arm defining a first cut-out. A profile of the first cut-out is configured to pivotally engage with the first stopper, such that pivotal engagement between the profile of the first cut-out and the first stopper allows the travel of the connecting module in the direction inward and outward with respect to the computing resource upon deflection of the first lever. The partition plate further includes a second stopper, and the second lever includes a second arm defining a second cut-out. A profile of the second cut-out is configured to pivotally engage with the second stopper, such that the pivotal engagement between the profile of the second cut-out and the second stopper allows the travel of the connecting module in the direction inward and outward with respect to the computing resource upon deflection of the second lever. In an implementation, the connecting module may be embodied as a front UPI module.

According to another aspect of the present disclosure, a method for disengaging a connecting module from a computing resource is disclosed. In an embodiment, the method includes actuating an actuator to unlatch a first lever and a second lever from a front side of a body of the connecting module. The method further includes deflecting the first lever and the second lever about respective first ends thereof upon unlatching the first lever and the second lever. The method also includes allowing travel of the connecting module in a direction outward with respect to the computing resource, based on the deflection of the first lever and the second lever.

In an embodiment, the method includes pivotally engaging a profile of a first cut-out with a first stopper. The first cut-out is defined in a first arm of the first lever and the first stopper is located on a partition plate of the computing resource.

In an embodiment, the method includes pivotally engaging a profile of a second cut-out with a second stopper. The second cut-out is defined in a second arm of the second lever and the second stopper is located on the partition plate of the computing resource.

Other aspects and advantages of non-limiting embodiments of the present disclosure will become apparent to those skilled in the art upon review of the following description of specific non-limiting embodiments of the disclosure in conjunction with the accompanying drawings.

BRIEF DESCRIPTION OF THE DRAWINGS

A better understanding of embodiments of the present disclosure (including alternatives and/or variations thereof) may be obtained with reference to the detailed description of the embodiments along with the following drawings, in which:

FIG. 6B is an isometric view of the computing resource showing the connecting module completely disengaged from the computing resource, according to an embodiment of the present disclosure.

DETAILED DESCRIPTION

Reference will now be made in detail to specific embodiments or features, examples of which are illustrated in the accompanying drawings. Wherever possible, corresponding or similar reference numbers will be used throughout the drawings to refer to the same or corresponding parts. Moreover, references to various elements described herein are made collectively or individually when there may be more than one element of the same type. However, such references are merely exemplary in nature. It may be noted that any reference to elements in the singular may also be construed to relate to the plural and vice-versa without limiting the scope of the disclosure to the exact number or type of such elements unless set forth explicitly in the appended claims.

Aspects of the present disclosure are directed to a computing resource, such as a server unit, implementing a connecting module capable of being disposed into a slot defined in the computing resource using minimum human effort. The connecting module includes levers capable of being pivotably deflected by a user to allow detachment of the connecting module from the computing resource. Likewise, the levers also enable the user to dispose the connecting module back into the slot of the computing resource. The connecting module eliminates use of any external tools to engage and disengage the connecting module from the computing resource.

Figure 1:
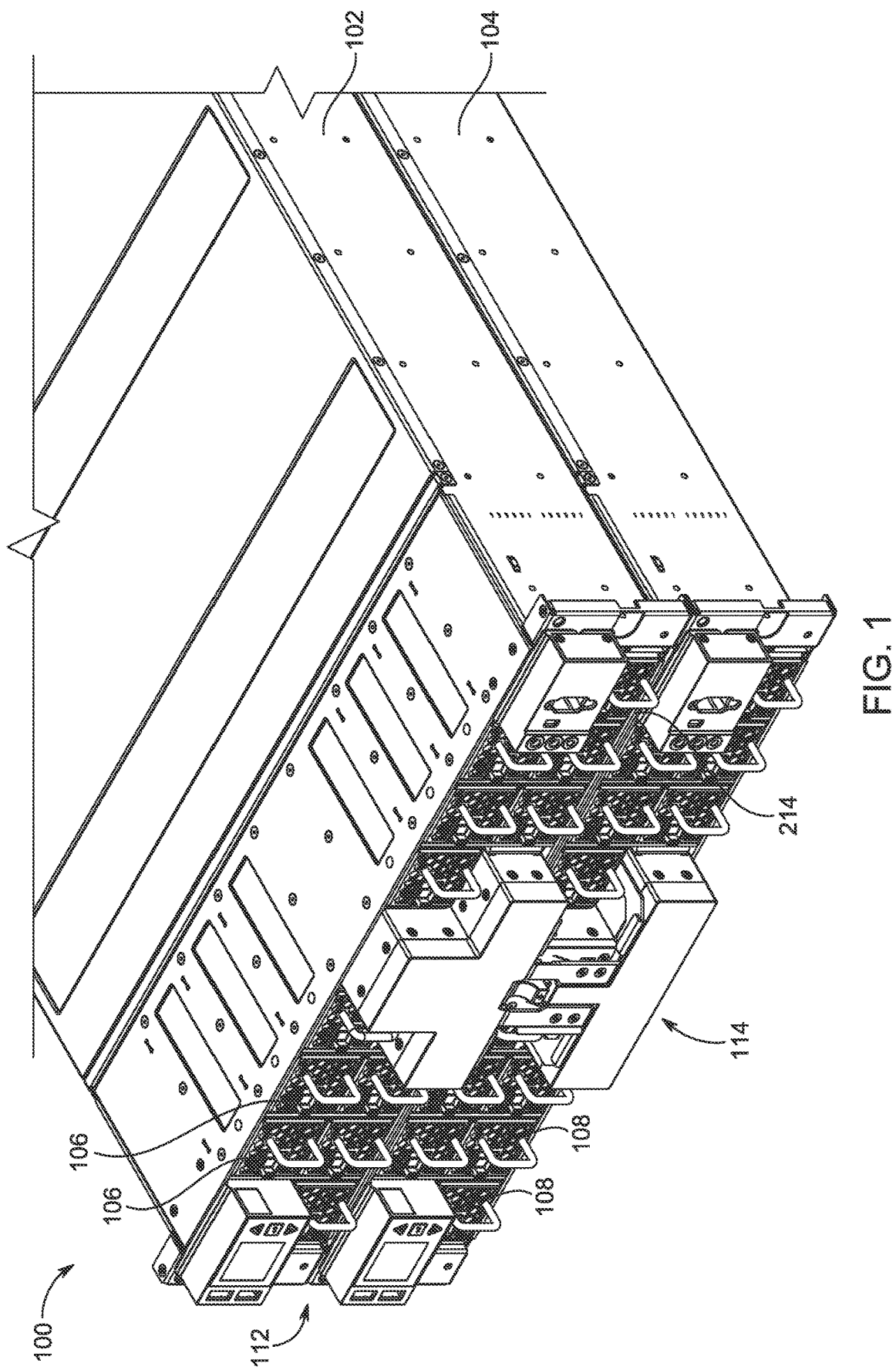
FIG. 1 is an isometric view of a computing resource including a connecting module, according to an embodiment of the present disclosure.

Referring to FIG. 1, an isometric view of a computing resource 100 is illustrated. According to an aspect of the present disclosure, the computing resource 100 is implemented as the server unit, and hence the term "computing resource 100" is alternatively referred to as "the server unit 100". The server unit 100 includes a first section 102 and a second section 104, where the first section 102 includes a first set of computing devices 106 and the second section 104 includes a second set of computing devices 108. As used herein, the term "computing devices" may include, but are not limited to, motherboards, multiple processors, random-access-memory (RAM), dual in-line memory modules (DIMMs) and multiple sockets to aid connection with the processors. It will be apparent to a person skilled in the art that the server unit 100 may be housed in a server rack (not shown) that is configured to accommodate multiple server units, switches, cords and cables, rails, cable management bars, routers, path panels, and blanking panels. For example, the server unit 100 may be a part of a scalable server infrastructure implementing customized high-performance computing systems. Although not explicitly shown, it will be understood that the server unit 100 may include, but is not limited to, motherboards, hard drives, network ports, one or more node controller systems, management systems, and power cables.

According to an embodiment of the present disclosure, the first section 102 and the second section 104 together defines a slot 110 (see FIG. 6B) at a front portion 112 thereof. The server unit 100 further includes a connecting module 114 configured to releasably dispose in the slot 110. The connecting module 114 is embodied as a front ultra-path interconnect (UPI) module in the present disclosure. Since the connecting module 114 is connected with the server unit 100 at the front portion 112, the connecting module 114 is alternatively referred to as the "front connecting module 114". Provision of the front connecting module 114 adds to available space in the server unit 100, thereby allowing additional components to be accommodated to enhance functionality of the server unit 100 as per user's requirement. Further, the connecting module 114 overcomes requirement of any external tools and fasteners for coupling with the server unit 100. In some implementations, the server unit 100 may also include a rear connecting module (not shown). The connecting module 114 is considered as a customer replaceable unit (CRU) that can be removed and replaced by users.

Figure 2A:
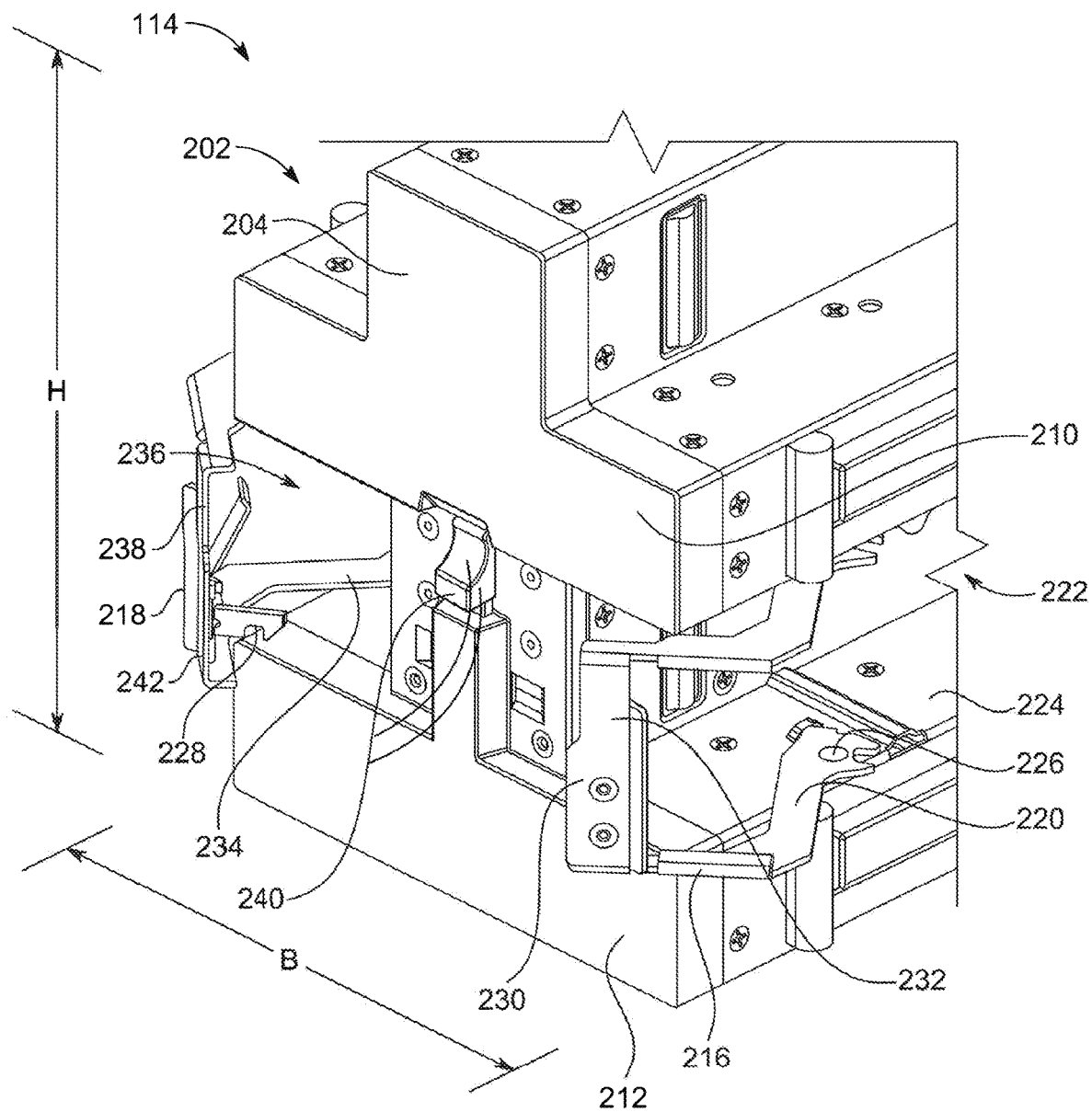
FIG. 2A is a front isometric view of the connecting module, according to an embodiment of the present disclosure.
Figure 2B:
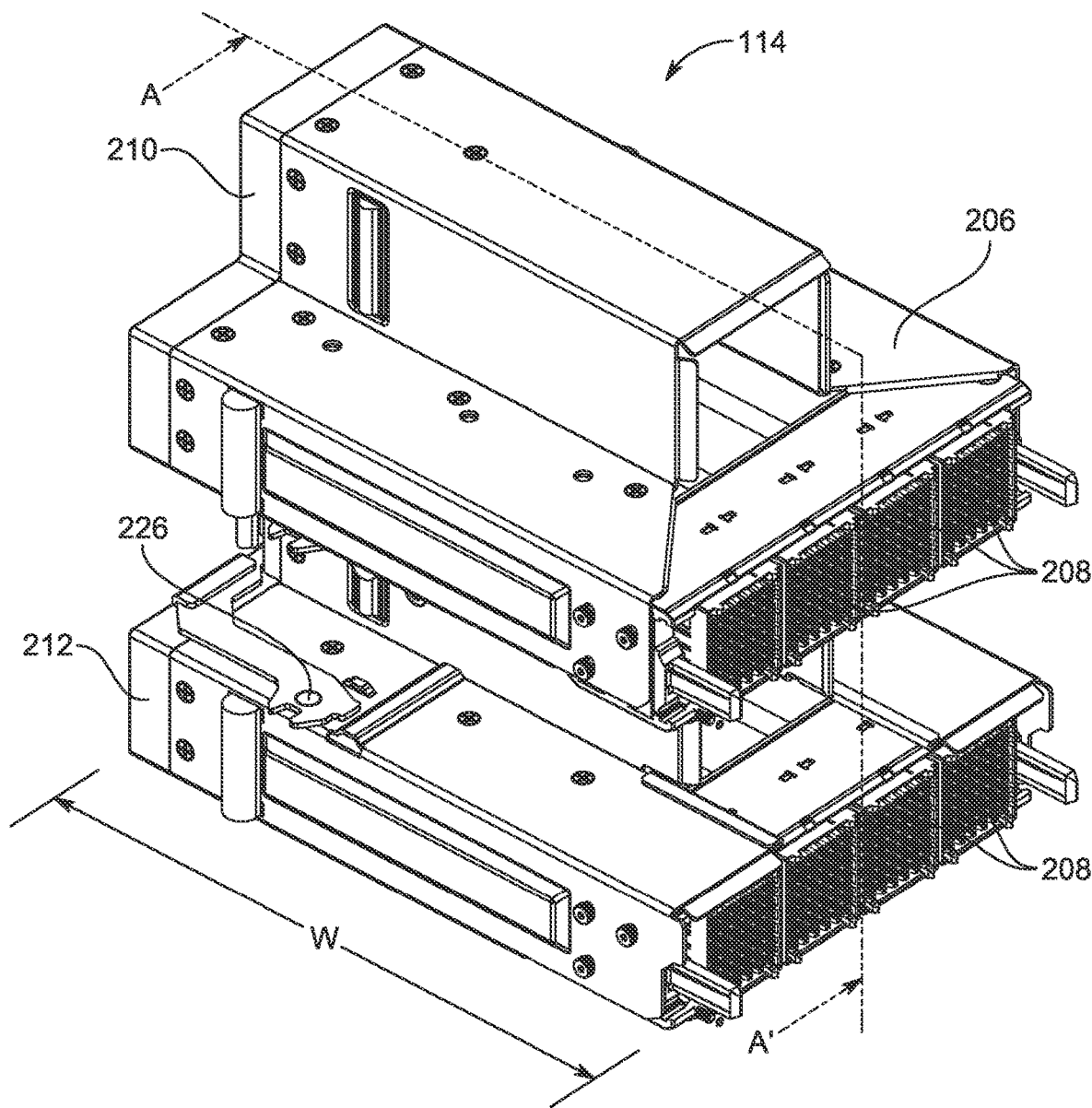
FIG. 2B is a rear isometric view of the connecting module, according to an embodiment of the present disclosure.

FIG. 2A illustrates a front isometric view of the connecting module 114 and FIG. 2B illustrates a rear isometric view of the connecting module 114, according to an embodiment of the present disclosure. The connecting module 114 includes a body 202 configured to engage with the server unit 100. As used herein, the term "configured to engage" refers to a structure of the body 202 dimensioned based on the slot 110 defined in the server unit 100. However, in some implementations, the slot 110 may be designed based on dimensions of the connecting module 114. The body 202 includes a front side 204 accessible to a user and a rear side 206 (see FIG. 2B) configured to releasably couple with the server unit 100. In an implementation, the rear side 206 of the body 202 includes a plurality of connectors 208 configured to define an ultra-path interconnect configuration and establish a connection between the first set of computing devices 106 and the second set of computing devices 108. In an implementation, the first set of computing devices 106 includes two central processing units (CPUs) and the second set of computing devices 108 includes two CPUs.

The plurality of connectors 208, specifically four (4) socket connectors according to a preferred embodiment of the present disclosure, are configured to communicably engage with the each of the four CPUs to allow data exchange between the four CPUs in random fashion. The term "communicably engage" refers to a state where the CPUs can communicate with one another. For instance, with the aid of the connecting module 114 of the present disclosure, a first CPU of the first set of computing devices 108 may communicate with a second CPU of the second set of computing devices. Alternatively, the term "communicably engage" may refer to communication channels established by the connecting module 114 between motherboards of each of the four CPUs.

In an embodiment, a height "H" of the body 202 may be dimensioned to be easy to hold or grasp by the user. The body 202 further includes a first interconnect part 210 extending between the front side 204 and the rear side 206 thereof and configured to engage with the first section 102 of the server unit 100. The body 202 further includes a second interconnect part 212 extending between the front side 204 and the rear side 206 thereof, configured to engage with the second section 104 of the server unit 100. Each of the first interconnect part 210 and the second interconnect part 212 extends along a width "W" of the body 202.

Figure 2C:
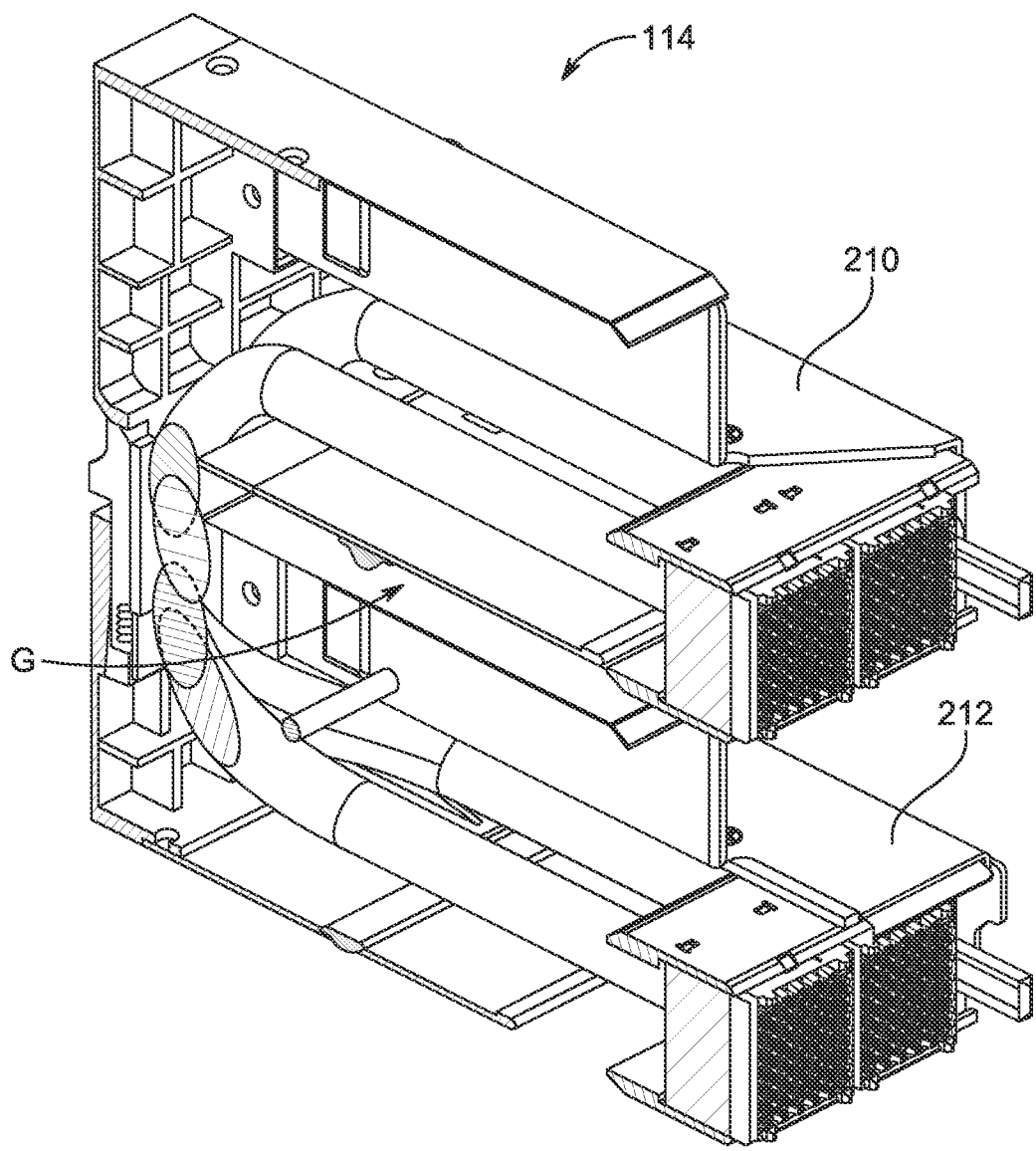
FIG. 2C is a cross-sectional view of the connecting module considered along a section A-A' in FIG. 2B, according to an embodiment of the present disclosure.

FIG. 2C illustrates a cross-sectional view of the connecting module 114 considered along a section line A-A' in FIG. 2B. In an embodiment, the first interconnect part 210 and the second interconnect part 212 are separated by a gap "G" configured to receive a partition plate 214 (shown in FIG. 1 and FIG. 4) of the server unit 100. The partition plate 214 is located between the first section 102 and the second section 104 of the server unit 100 and may include, but not limited to, the node controller systems and the management systems.

Referring to FIG. 2A, the connecting module 114 further includes a first lever 216 and a second lever 218. The first lever 216 includes a first end 220 pivotally coupled to a first side 222 of the body 202. As can be seen in FIG. 2A, the first end 220 of the first lever 216 is coupled to a surface 224 of the second interconnect part 212 through a pivot pin 226 (also shown in FIG. 2B). With the aid of the pivot pin 226, the first lever 216 may be deflected and rotated about the pivot pin 226 with respect to the front side 204 of the body 202. Further, a second end 230 of the first lever 216 is configured to latch with the front side 204 of the body 202. In an embodiment, the second end 230 may be latched to the front side 204 of the body 202 via a snap lock, such as a snap 314 (see FIG. 3A and FIG. 3B).

In an embodiment, the first lever 216 also includes a handle 232 (alternatively referred to as "first handle 232" in the present disclosure) accessible by the user. In an example, the handle 232 may be ergonomically designed to allow easy access by the user. For example, the handle 232 may be provided at the second end 230 so that the user can grasp the handle 232 and then the first lever 216 can be rotated about the pivot pin 226.

Similarly, the second lever 218 includes a first end 234 pivotally coupled to a second side 236 of the body 202 through another pivot pin (not shown) located at a position corresponding to the pivot pin 226 on the first side 222. The second side 236 is located opposite to the first side 222 of the body 202 along a breadth "B" of the connecting module 114. With reference to the user facing the server unit 100, the first lever 216 and the second lever 218 may alternatively be referred to as a right lever and a left lever, respectively. Further, a second end 242 of the second lever 218 is configured to latch with the front side 204 of the body 202 via a snap 228. The second lever 218 also includes a handle 238 (alternatively referred to as "the second handle 238" in the present disclosure) accessible by the user. A latched condition of the first lever 216 and the second lever 218 is illustrated in FIG. 1, where the second ends of the first lever 216 and the second lever 218 are in flush with the front side 204 of the body 202. Additionally, in the latched condition of the first lever 216 and the second lever 218, the connecting module 114 is communicably engaged with the first set of computing devices 106 and the second set of computing devices 108.

In an embodiment, the connecting module 114 also includes an actuator 240 disposed on the front side 204 of the body 202. The actuator 240 is configured to allow disengagement of the connecting module 114 from the server unit 100 upon actuation, and to unlatch the second ends of each of the first lever 216 and the second lever 218 from the front side 204 of the body 202. Upon being unlatched, each of the first lever 216 and the second lever 218 can be selectively and manually deflected with respect to the first ends thereof to allow travel of the connecting module 114 in a direction inward and outward with respect to the server unit 100. A manner in which the actuator 240 aids unlatching of the second ends of each of the first lever 216 and the second lever 218 is described later in the description. In some implementations, the body 202, the first lever 216, the second lever 218, and the actuator 240 may be made of one of stainless steel or casted aluminum. As such, in an example embodiment, each of these components may be provided with smooth surface finish to add to the aesthetics of the connecting module 114.

Figure 3A:
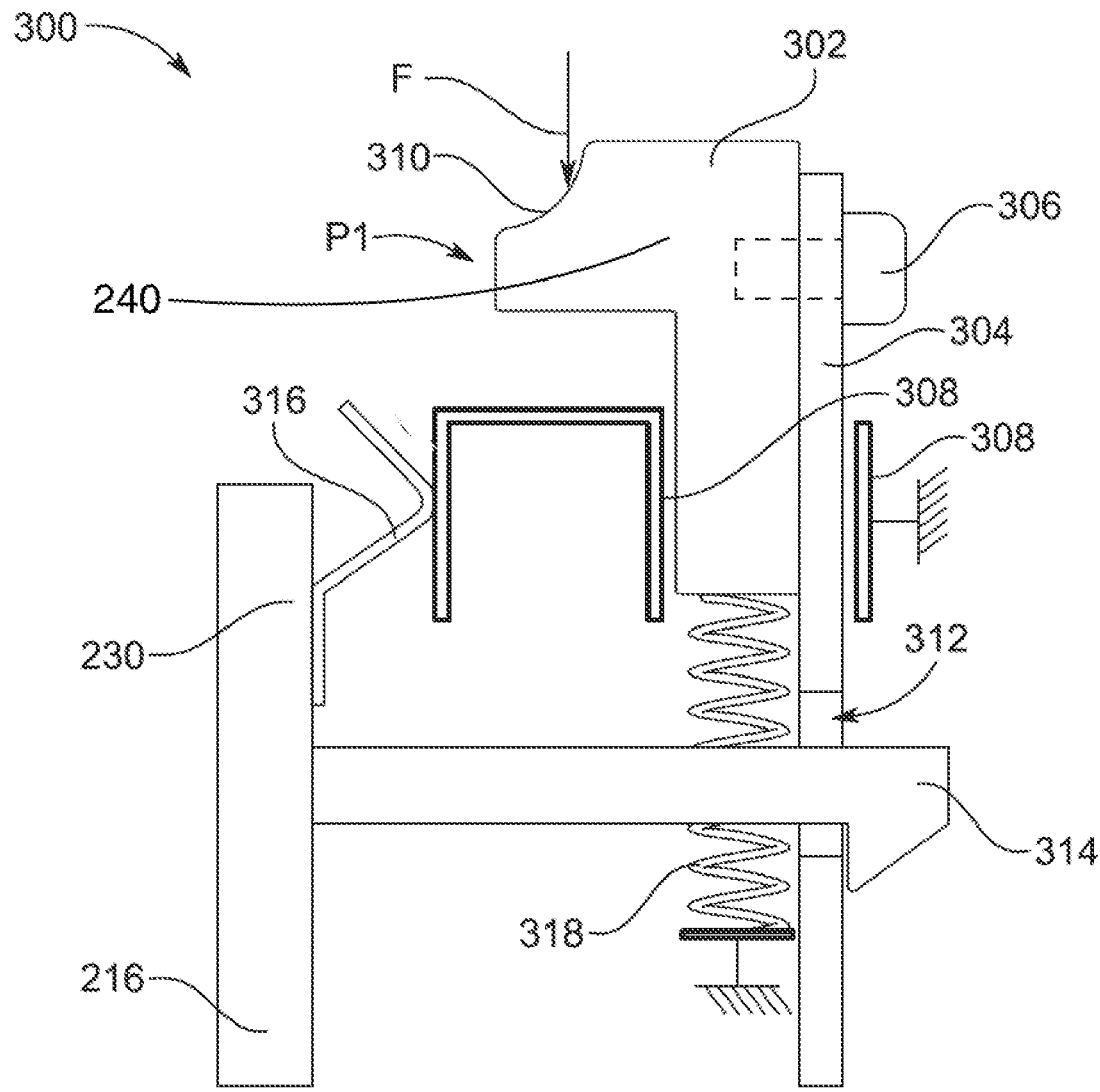
FIG. 3A is a lever locking mechanism of the connecting module showing a first position of an actuator of the lever locking mechanism, according to an embodiment of the present disclosure.
Figure 3B:
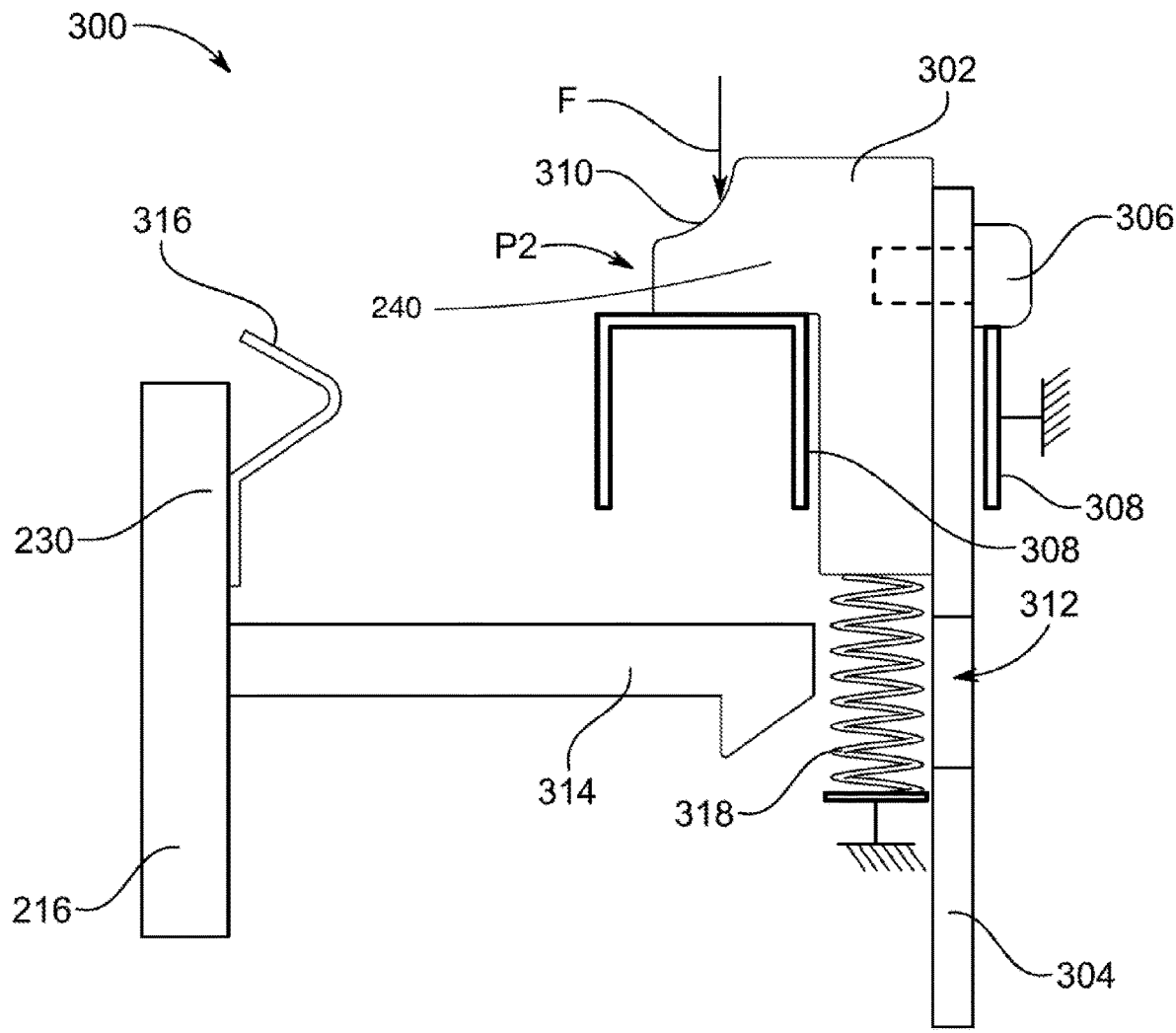
FIG. 3B is the lever locking mechanism of the connecting module showing a second position of the actuator of the lever locking mechanism, according to an embodiment of the present disclosure.

FIG. 3A and FIG. 3B illustrates a lever locking mechanism 300 of the connecting module 114 and will be described in conjunction with FIG. 1 to FIG. 2B. By providing the actuator 240 on the front side 204 of the body 202, the actuator 240 is made accessible to the user. In an implementation, the actuator 240 includes a push button 302 configured to slide between a first position "P1" and a second position "P2" along the front side 204 of the body 202. For example, FIG. 3A depicts the first position "P1" of the push button 302 and the FIG. 3B depicts the second position "P2" of the push button 302.

In an embodiment, the push button 302 is fastened to a slider 304 via a fastener 306 and the slider 304 extends along the front side 204 of the body 202. The push button 302 and the slider 304 are together movably disposed between guide members 308 in the body 202. As can be seen from FIG. 3A and FIG. 3B, the guide members 308 allow for a linear movement of the push button 302 and the slider 304. An arcuate surface 310 of the push button 302 is provided to receive a push force via a finger of the user, where the push force "F" causes the linear movement of the push button 302 along the front side 204 of the body 202. Further, the slider 304 defines two openings to receive the snaps of the first lever 216 and the second lever 218. For example, one opening is defined in the slider 304 on each side of the push button 302. For the purpose of brevity, FIG. 3A and FIG. 3B depicts working of the lever locking mechanism 300 with respect to the push button 302 and the first lever 216.

Accordingly, the snap 314 of the first lever 216 engages with a first opening 312 defined in the slider 304. In the first position "P1" of the push button 302, the snap 314 of the first lever 216 is secured against the slider 304, thereby retaining the first lever 216 latched to the front side 204 of the body 202.

In an embodiment, the connecting module 114 includes a first leaf spring 316, where one end of the first leaf spring 316 is attached to the second end 230 of the first lever 216 and a free end of the first leaf spring 316 is located against the front side 204 of the body 202 when the first lever 216 is latched to the body 202. As such, in the first position "P1" of the push button 302, the first lever 216 remains latched with the body 202 against a biasing force of the first leaf spring 316.

The lever locking mechanism 300 also includes a biasing member 318, for example, a spring, located along the front side 204 of the body 202 and coupled to the push button 302. The biasing member 318 is configured to retain the actuator 240 in the first position "P1" corresponding to a normal state thereof the biasing member 318 and apply a biasing force on the actuator 240 in the second position "P2" corresponding to a biased state thereof. As used herein, the term "normal state" refers to a free length condition of the biasing member 318 where no force is incident on the biasing member 318, and the term "biased state" refers to a compressed length condition of the biasing member 318 where the push force "F" is incident on the biasing member 318.

Upon application of the push force "F" by the user, the push button 302 is actuated towards the second position "P2". Accordingly, the push button 302 and the slider 304 are caused to move along the front side 204 of the body 202 and against the biasing force of the biasing member 318, thereby compressing the biasing member 318 as shown in FIG. 3B. Due to the movement of the slider 304, the snap 314 is released from the slider 304 through the first opening 312. As such, in the second position "P2" of the push button 302, the first lever 216 is unlatched from the front side 204 of the body 202. Simultaneously, by virtue of the biasing force of the first leaf spring 316, the first lever 216 is forced to move in a direction outward with respect to the server unit 100. Such outward movement of the first lever 216 further allows disengagement of the connecting module 114 from the server unit 100. To this end, it is understood that the second ends of each of the first lever 216 and the second lever 218 remains latched to the front side 204 of the body 202 in the normal state of the biasing member 318 corresponding to the first position "P1" of the push button 302 and is unlatched from the front side 204 of the body 202 in the biased state of the biasing member 318 corresponding to the second position "P2" of the push button 302. Therefore, besides unlatching the first lever 216 and the second lever 218 from the front side 204 of the body 202, the actuator 240 is configured to allow disengagement of the connecting module 114 from the first set of computing devices 106 and the second set of computing devices 108 upon actuation.

Soon after the user removes the finger from the arcuate surface 310 of the push button 302 and the push forces "F" ceases to act on the push button 302, by virtue of the biasing force of the biasing member 318, the push button 302 is forced to the first position "P1". Although not illustrated, the connecting module 114 further includes a second leaf spring configured to apply a biasing force on the second lever 218 in a latched condition of the second lever 218.

In some implementations, the push button 302 and the slider 304 may be provided as a single component configured to slide in the direction of application of push force and unlatch each of the first lever 216 and the second lever 218 from the front side 204 of the body 202.

Figure 4:
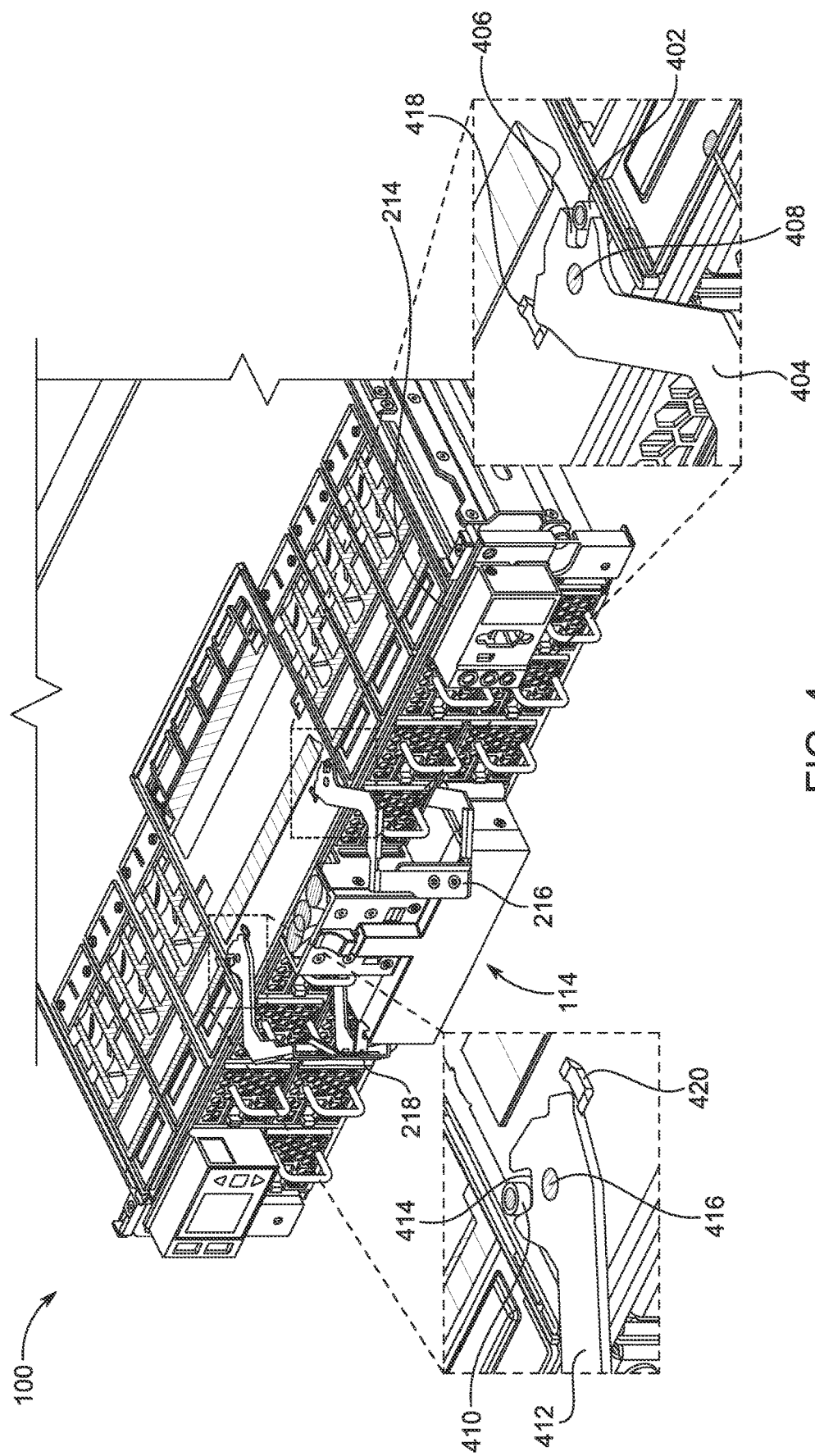
FIG. 4 is a cross-sectional view of the computing resource showing unlatched levers of the connecting module, according to an embodiment of the present disclosure.

FIG. 4 illustrates a cross-sectional view of the server unit 100 showing unlatched condition of the first lever 216 and the second lever 218 of the connecting module 114. In an embodiment, the partition plate 214 includes a first stopper 402 and the first lever 216 includes a first arm 404 defining a first cut-out 406. The end of the first arm 404 defining the first cut-out 406 is pivotally coupled to the first interconnect part 210 (not shown in FIG. 4) on the first side 222 of the body 202 via a first pivot member 408. In one example, the first pivot member 408 may be embodied similar to the pivot pin 226. As such, a profile of the first cut-out 406 is configured to pivotally engage with the first stopper 402. The connecting module 114 also includes a first support member 418 to retain the first cut-out 406 pivotally engaged with the first stopper 402. A combined effect of manual deflection of the first lever 216 and the pivotal engagement between the profile of the first cut-out 406 and the first stopper 402 allows travel of the connecting module 114 in the direction inward and outward with respect to the server unit 100 upon deflection of the first lever 216 after being unlatched from the front side 204 of the body 202.

The partition plate 214 also includes a second stopper 410 and the second lever 218 includes a second arm 412 defining a second cut-out 414. An end of the second arm 412 defining the second cut-out 414 is pivotally coupled to the first interconnect part 210 (not shown in FIG. 4) on the second side 236 of the body 202 via a second pivot member 416. In one example, the second pivot member 416 may be embodied similar to the pivot pin 226. In an embodiment, a profile of the second cut-out 414 is configured to pivotally engage with the second stopper 410. The connecting module 114 also includes a second support member 420 to retain the second cut-out 414 pivotally engaged with the second stopper 410. A combined effect of manual deflection of the second lever 218 and the pivotal engagement between the profile of the second cut-out 414 and the second stopper 410 allows the travel of the connecting module 114 in the direction inward and outward with respect to the server unit 100 upon deflection of the second lever 218 after being unlatched from the front side 204 of the body 202. It will be understood that the first lever 216 and the second lever 218 need to be simultaneously deflected by the user to cause the travel of the connecting module 114 in the direction inward and outward with respect to the server unit 100. Additionally, profiles of the first cut-out 406 and the second cut-out 414 are for illustration purpose only and should not be considered as limiting. In some implementations, the first support member 418 and the second support member 420 may be provided in the partition plate 214. Each of the first support member 418 and the second support member 420 are provided to restrict the manual deflection of the first lever 216 and the second lever 218, respectively, while ejecting the connecting module 114 from the server unit 100.

Figure 5:
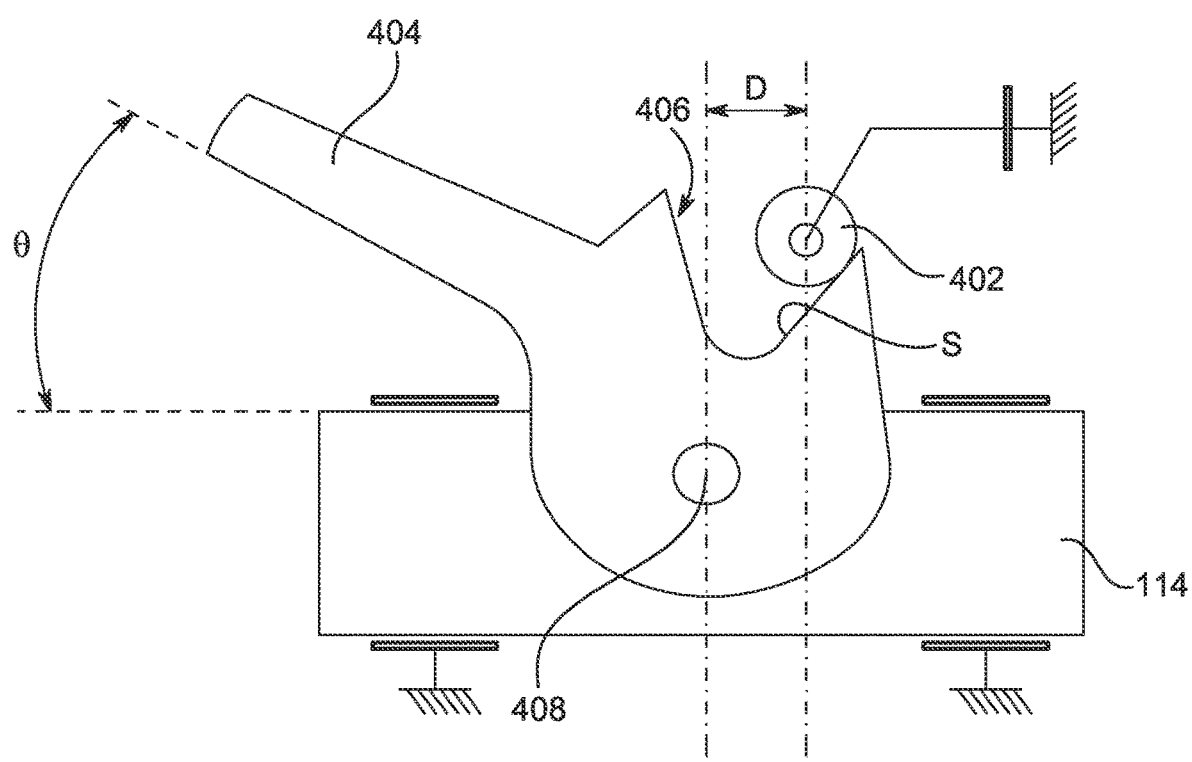
FIG. 5 is a schematic view of a travel mechanism of the connecting module, according to an exemplary embodiment of the present disclosure.

FIG. 5 illustrates a schematic view of a travel mechanism of the connecting module 114 according to an exemplary embodiment of the present disclosure. As seen in FIG. 4, each of the first stopper 402 and the second stopper 410 are fixed to the partition plate 214. For the purpose of brevity, the travel mechanism of the connecting module 114 is described with respect to the first arm 404 and the first stopper 402. As shown, the first pivot member 408 and the first stopper 402 are offset by a distance "D". When the first lever 216 is selectively and manually deflected (also referred to as "rotated"), a surface "S" of the first cut-out 406 remains in contact with the first stopper 402. Additionally, the connecting module 114 is received within the slot 110 and hence restricted in degree of freedom of movement. With such arrangement, a rotational movement of the first arm 404 is translated to linear movement of the connecting module 114. Therefore, manual rotation of the first lever allows travel of the connecting module 114 in the direction outward with respect to the server unit 100 or in a direction inward with respect to the surface "S".

In an implementation, the manual and simultaneous rotation of the first lever 216 and the second lever 218 may achieve a travel distance of the connecting module 114 in a range of about 2.5 mm to about 4 mm.

In some implementations, each of the first lever 216 and the second lever 218 are configured to pivotally deflect about respective first ends thereof with a covered angle (θ) in a range of about 30 degrees to about 50 degrees.

In some implementations, each of the first lever 216 and the second lever 218 are configured to pivotally deflect about respective first ends thereof with the covered angle (θ) in a range of about 35 degrees to about 45 degrees.

Figure 6A:
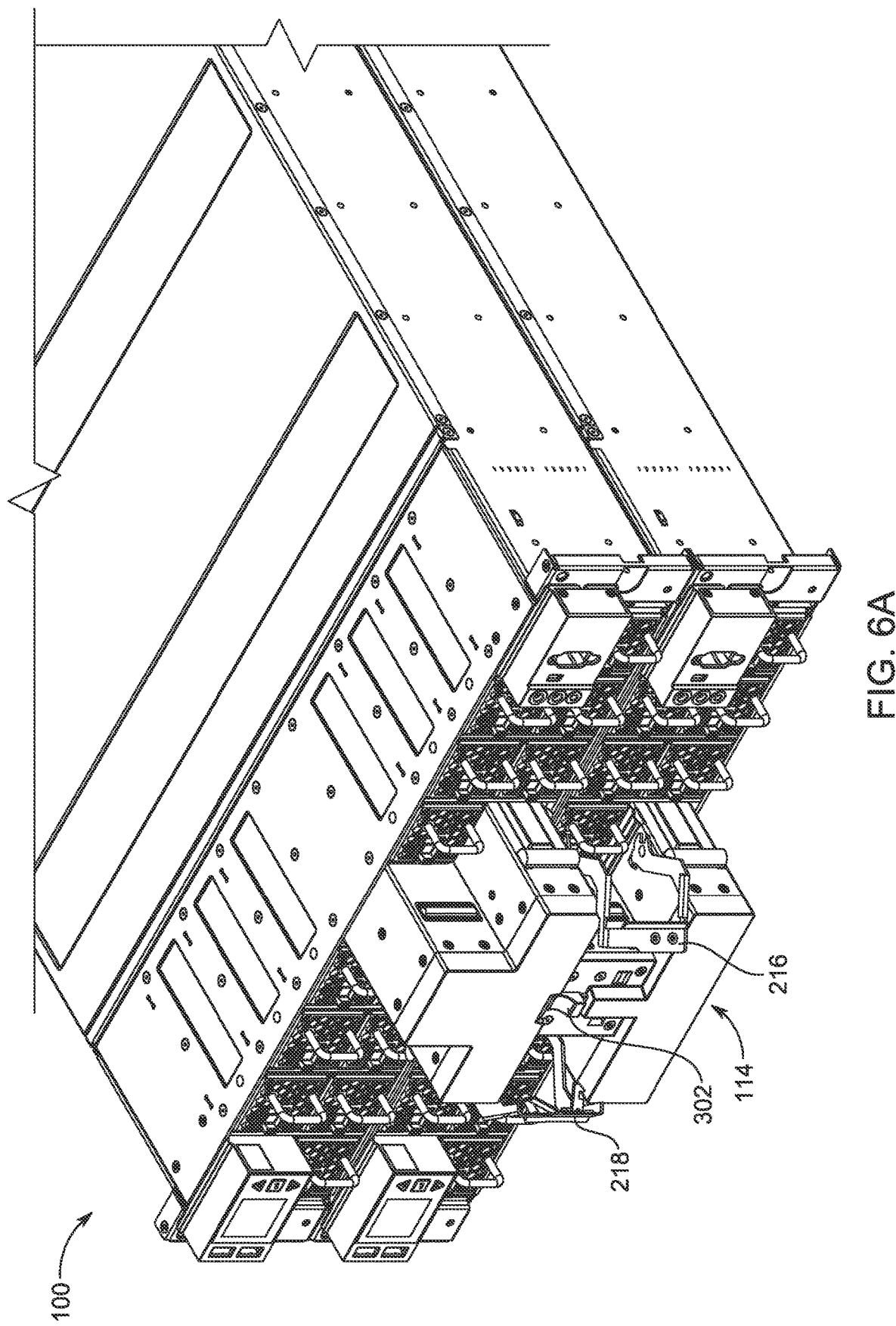
FIG. 6A is an isometric view of the computing resource showing the connecting module being disengaged from the computing resource, according to an embodiment of the present disclosure.

FIG. 6A illustrates an isometric view of the server unit 100 showing the connecting module 114 being disengaged from the server unit 100 and FIG. 6B shows the connecting module 114 completely disengaged from the server unit 100. FIG. 6A and FIG. 6B will be described in conjunction with FIG. 1 through FIG. 5. In order to disengage or unplug the connecting module 114 from the server unit 100, the user may actuate the actuator 240 by applying the push force "F" on the push button 302. The application of the push force "F" causes the push button 302 and the slider 304 to move along the front side 204 of the body 202 in the direction of an application of the push force "F", thereby unlatching the first lever 216 and the second lever 218 from the front side 204 of the body 202. The unlatching of the first lever 216 and the second lever 218 allows the user to access respective handles.

Further, the user may simultaneously rotate each of the first lever 216 and the second lever 218 in a direction outward with respect to the front side 204 of the body 202. Such rotation of the first lever 216 and the second lever 218 causes the first arm 404 and the second arm 412 to pivot about the first stopper 402 and the second stopper 410, respectively, thereby resulting in outward travel of the connecting module 114 with respect to the server unit 100. The user may then grasp the connecting module 114 in hand and pull the connecting module 114 in the direction further outward to completely disengage the connecting module 114 from the server unit 100. In some implementations, periphery of the slot 110 in the server unit 100 may be made smooth to reduce development of friction while the connecting module 114 is being unplugged.

In order to plug the connecting module 114 into the slot 110 of the server unit 100, the user may align the connecting module 114 with the slot 110 in the server unit 100. The user may then gradually insert the connecting module 114 into the slot 110. The first stopper 402 and the second stopper 410 guides the first arm 404 and the second arm 412, such that the first cut-out 406 engages with the first stopper 402 and the second cut-out 414 engages with the second stopper 410. Particularly, a surface opposite to the surface "S" of the first cut-out 406 contacts the first stopper 402 to auto-engage the surface "S" with the first stopper 402 during the insertion of the connecting module 114 into the slot 110. Simultaneously, corresponding surfaces of the second cut-out 414 engages with the second stopper 410. Further inward push of the connecting module 114 causes the first lever 216 and the second lever 218 to gradually rotate in the direction towards the front side 204 of the body 202. The user may then hold the handles of the first lever 216 and the second lever 218 and rotate the first lever 216 and the second lever 218 simultaneously inward with respect to the server unit 100 until each of the first lever 216 and the second lever 218 latches with the front side 204 of the body 202. As described earlier, in the latched condition of the first lever 216 and the second lever 218, the connecting module 114 remains communicably engaged with the first set of computing devices 106 and the second set of computing devices 108.

In some implementations, the connecting module 114 may include a single lever configured to unlatch the connecting module 114 from the server unit 100. To this end, the connecting module 114 may be plugged to the server unit 100 and unplugged from the server unit 100 without need of any external tools. Therefore, the present disclosure provides a tool-less connecting module 114. Since the first lever 216 and the second lever 218 are integral to the connecting module 114 and aid in engaging the UPI module 114 into the slot 110 of the server unit 100, any requirement of fasteners, such as captive screws, may be overcome. As such, a time required to unplug and plug the connecting module 114 with respect to the server unit 100 may be largely reduced. Since ejection of the connecting module 114 includes only two steps, namely, actuation of the actuator 240 and the simultaneous rotation of the first lever 216 and the second lever 218, effort to be invested by the user is substantially reduced compared to the conventional methods. Additionally, since the actuation of the actuator 240 is achieved by a single finger, ejection process is rendered simple. Therefore, the connecting module 114 of the present disclosure aligns with the requirements of a customer replaceable unit (CRU).

In some implementation, the lever locking mechanism 300 described with respect to FIG. 3A and FIG. 3B, and the travel mechanism described with respect to FIG. 5 may be implemented with respect to other components of the server unit 100. For example, the lever locking mechanism 300 may be implemented for drawers of the server unit 100. For example, a single lever may be implemented in a drawer (for example, a tray) in the server unit 100 for linearly moving the drawer inward and outward with respect to the server unit 100. The drawer may be configured to accommodate multiple components of the server unit 100, for example, cooling modules. In some implementations, the lever locking mechanism 300 may be implemented in handles of the server unit 100 to engage rear connectors of motherboard with rear connecting module. In some implementations, the lever locking mechanism 300 may be provided in rear input-output (I/O) modules.

Although the present disclosure describes the implementation of the connecting module 114 with respect to the server unit 100, in some implementation, the connecting module 114 may be implemented in, for example, but not limited to, scalable memory devices, scalable storage devices, central processing units (CPUs), accelerators, switches and routers.

Figure 7:
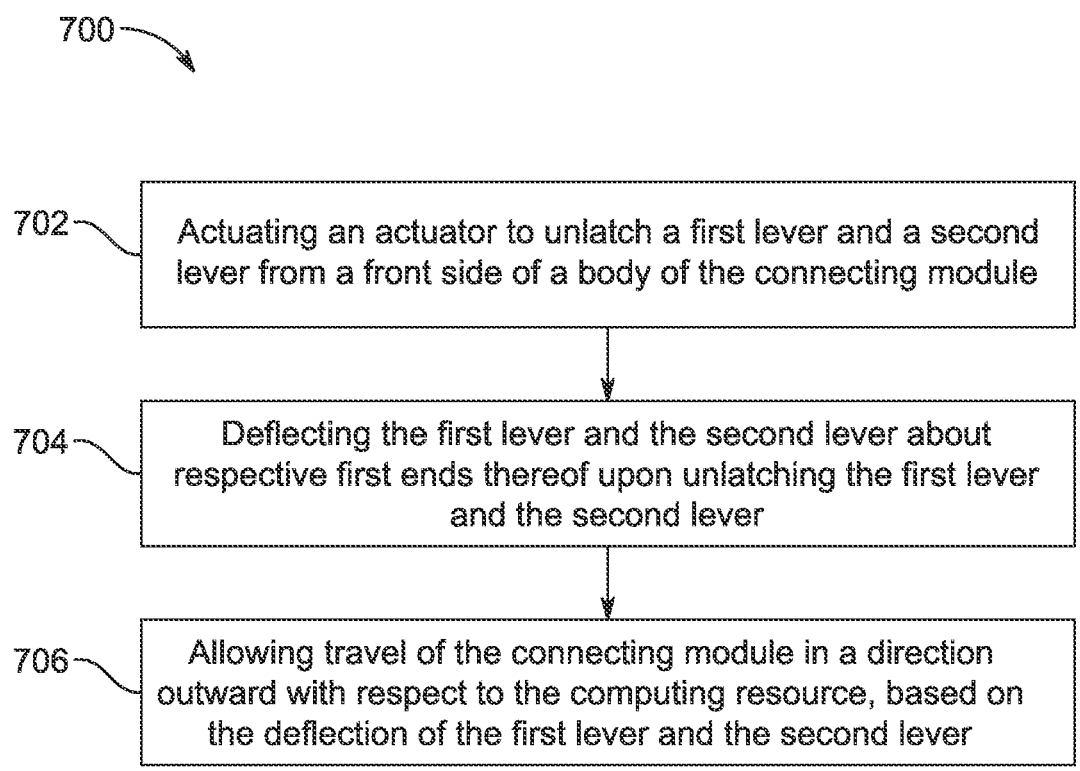
FIG. 7 is a flowchart of a method for disengaging a connecting module from a computing resource, according to an embodiment of the present disclosure.

FIG. 7 shows a flowchart of a method 700 for disengaging the connecting module 114 from the computing resource 100. At step 702, the method 700 includes actuating the actuator 240 to unlatch the first lever 216 and the second lever 218 from the front side 204 of the body 202 of the connecting module 114.

At step 704, the method 700 includes deflecting the first lever 216 and the second lever 218 about respective first ends 220, 234 thereof upon unlatching the first lever 216 and the second lever 218. In an embodiment, each of the first lever 216 and the second lever 218 is configured to pivotally deflect about respective first ends 220, 234 thereof with a covered angle (θ) in a range of about 30 degrees to about 50 degrees.

At step 706, the method 700 includes allowing travel of the connecting module 114 in the direction outward with respect to the computing resource 100, based on the deflection of the first lever 216 and the second lever 218.

Although not particularly shown as steps in FIG. 7, the method 700 further includes sliding the push button 302 between the first position "P1" and the second position "P2" along the front side 204 of the body 202, against the biasing force of the biasing member 318, to unlatch the first lever 216 and the second lever 218 from the front side 204 of the body 202.

In an embodiment, the method 700 further includes pivotally engaging the profile of the first cut-out 406 with the first stopper 402, where the first cut-out 406 is defined in the first arm 404 of the first lever 216 and the first stopper 402 is located on the partition plate 214 of the computing resource 100. The method 700 also includes pivotally engaging the profile of the second cut-out 414 with a second stopper 410, where the second cut-out 414 is defined in the second arm 412 of the second lever 218 and the second stopper 410 is located on the partition plate 214 of the computing resource 100.

All terminologies used herein are for purposes of describing embodiments and examples and should not be construed as limiting the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by the person skilled in the art to which this present disclosure belongs. Furthermore, terms, such as those defined in commonly used dictionaries, should be interpreted as having a meaning that is consistent with their meaning in the context of the relevant art and will not be interpreted in an idealized or overly formal sense unless expressly defined herein.

While aspects of the present disclosure have been particularly shown and described with reference to the embodiments above, it will be understood by those skilled in the art that various additional embodiments may be contemplated by the modification of the disclosed methods without departing from the spirit and scope of what is disclosed. Such embodiments should be understood to fall within the scope of the present disclosure as determined based upon the claims and any equivalents thereof.

The invention claimed is:

1. A connecting module comprising:
   a body configured to engage with a computing resource, the body comprising
   a front side accessible to a user,
   a rear side configured to releasably couple with the computing resource,
   a first interconnect part configured to engage with a first section of the computing resource, and
   a second interconnect part configured to engage with a second section of the computing resource;
   a first lever comprising
   a first end pivotally coupled to a first side of the body,
   wherein said first end of said first lever is rotatably coupled to a first surface of said first interconnect part through a first pivot pin via a first arm of said first lever, and
   wherein said first end of said first lever is rotatably coupled to a second surface of the first interconnect part through a second pivot pin via a second arm of said first lever, and
   a second end configured to latch with the front side of the body,
   wherein said first lever comprising a first handle at said second end of the first lever that extends vertically along a height of said body allowing said user to rotate said first lever about said first pivot pin and said second pivot pin along a first vertical axis parallel to said front side of said body and perpendicular to said first surface;
   a second lever comprising
   a first end pivotally coupled to a second side of the body,
   wherein said first end of said second lever is rotatably coupled to a first surface of the second interconnect part through a third pivot pin via a first arm of said second lever, and
   wherein said first end of said second lever is rotatably coupled to a second surface of the second interconnect part through a fourth pivot pin via a second arm of said second lever, and
   a second end configured to latch with the front side of the body,
   the second side of the body being opposite to the first side of the body, said second lever comprising a second handle at said second end of the second lever that extends vertically along said height of said body allowing said user to rotate said second lever about said third pivot pin and said fourth pivot pin along a second vertical axis parallel to said front side of said body and perpendicular to said second surface; and an actuator disposed on the front side of the body and configured to allow disengagement of the connecting module from the computing resource upon actuation, the actuator further configured to unlatch the second end of the first lever and the second end of the second lever from the front side of the body, and wherein each of the first lever and the second lever are selectively and manually deflectable about said respective first ends thereof to allow travel of the connecting module in a direction inward and outward with respect to the computing resource.

2. The connecting module according to claim 1, wherein each of the first interconnect part and the second interconnect part extend from the front side of the body along a width thereof.

3. The connecting module according to claim 2, wherein the first interconnect part and the second interconnect part are separated by a gap configured to receive a partition plate of the computing resource located between the first section of the computing resource and the second section of the computing resource.

4. The connecting module according to claim 3, wherein the partition plate comprises a first stopper, and wherein said second arm of said first lever defines a first cut-out, wherein a profile of the first cut-out is configured to pivotally engage with the first stopper, and wherein pivotal engagement between the profile of the first cut-out and the first stopper allows the travel of the connecting module in the direction inward and outward with respect to the computing resource upon deflection of the first lever.

5. The connecting module according to claim 4, wherein the partition plate further comprises a second stopper, and wherein said second arm of said second lever defines a second cut-out, wherein a profile of the second cut-out is configured to pivotally engage with the second stopper, and wherein the pivotal engagement between the profile of the second cut-out and the second stopper allows the travel of the connecting module in the direction inward and outward with respect to the computing resource upon deflection of the second lever.

6. The connecting module according to claim 1, wherein the rear side of the body comprises a plurality of connectors configured to connect with computing devices of the computing resource.

7. The connecting module according to claim 1, wherein the actuator comprises
a push button configured to slide between a first position and a second position along the front side of the body; and
a biasing member coupled to the push button, the biasing member configured to retain the actuator in the first position corresponding to a normal state of the biasing member and to apply a biasing force on the actuator in the second position corresponding to a biased state of the biasing member,
wherein the second end of the first lever and the second end of the second lever remains latched to the front side of the body in the normal state of the biasing member and unlatched from the front side of the body in the biased state of the biasing member.

8. The connecting module according to claim 7, wherein a first leaf spring is configured to apply a biasing force on the first lever in a latched condition of the first lever and a second leaf spring configured to apply a biasing force on the second lever in a latched condition of the second lever.

9. The connecting module according to claim 7, wherein the first lever and the second lever are latched to the front side of the body via a snap lock.

10. The connecting module according to claim 1, wherein each of the first lever and the second lever is configured to pivotally deflect about said respective first ends thereof with a covered angle in a range of about 30 degrees to about 50 degrees.

11. The connecting module according to claim 1, wherein each of the first lever and the second lever is configured to pivotally deflect about said respective first ends thereof with a covered angle in a range of about 35 degrees to about 45 degrees.

12. The connecting module according to claim 1, wherein the travel of the connecting module is in a range of about 2.5 mm to about 4 mm.

13. A method for disengaging a connecting module from a computing resource, the method comprising:
actuating an actuator to unlatch a first lever and a second lever from a front side of a body of the connecting module,
wherein said body comprises
said front side accessible to a user,
a rear side configured to releasably couple with the computing resource,
a first interconnect part configured to engage with a first section of the computing resource, and
a second interconnect part configured to engage with a second section of the computing resource, wherein said second interconnect part comprises a first surface and a second surface;
wherein said first lever comprises a first end, a second end and a first handle at said second end of the first lever allowing said user to rotate said first lever about a first pivot pin along a first vertical axis parallel to said front side of said body and perpendicular to said first surface of said second interconnect part,
wherein said second lever comprises a first end, a second end, and a second handle at said second end of the second lever allowing said user to rotate said second lever about a second pivot pin along a second vertical axis parallel to said front side of said body and perpendicular to said second surface of said second interconnect part,
wherein said first end of said first lever is coupled to said first surface of the second interconnect part through said first pivot pin and wherein said first end of said second lever is coupled to said second surface of the second interconnect part through said second pivot pin;
deflecting the first lever and the second lever about said respective first ends using the first handle around the first vertical axis thereof and the second handle around the second vertical axis thereof upon unlatching the first lever and the second lever; and
allowing travel of the connecting module in a direction outward with respect to the computing resource, based on the deflecting of the first lever and the second lever.

14. The method according to claim 13, further comprising pivotally engaging a profile of a first cut-out with a first stopper, wherein the first cut-out is defined in a second arm of the first lever and the first stopper is located on a partition plate of the computing resource.

15. The method according to claim 14, further comprising pivotally engaging a profile of a second cut-out with a second stopper, wherein the second cut-out is defined in a second arm of the second lever and the second stopper is located on the partition plate of the computing resource.

\* \* \* \* \*